(12) United States Patent
Ramakrishnan et al.

(10) Patent No.: US 12,219,734 B2
(45) Date of Patent: Feb. 4, 2025

(54) ULTRA DENSE PROCESSORS WITH EMBEDDED MICROFLUIDIC COOLING

(71) Applicant: Microsoft Technology Licensing, LLC, Redmond, WA (US)

(72) Inventors: Bharath Ramakrishnan, Bellevue, WA (US); Husam Atallah Alissa, Redmond, WA (US); Christian L. Belady, Mercer Island, WA (US); Sean Michael James, Olympia, WA (US); Vaidehi Oruganti, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 316 days.

(21) Appl. No.: 17/848,755

(22) Filed: Jun. 24, 2022

(65) Prior Publication Data
US 2023/0422435 A1 Dec. 28, 2023

(51) Int. Cl.
*H05K 7/20* (2006.01)
*G06F 1/20* (2006.01)
*H01M 8/18* (2006.01)

(52) U.S. Cl.
CPC ......... *H05K 7/20263* (2013.01); *G06F 1/206* (2013.01); *H05K 7/20272* (2013.01); *H01M 8/184* (2013.01)

(58) Field of Classification Search
CPC ... Y02E 60/10; H01L 23/473; H01L 2924/00; H01L 25/0657; H01L 2225/06589; H01L 21/4882; H01L 21/486; H01M 8/04067; H01M 8/0267; H01M 8/04007; H01M 8/04074; H01M 8/2455; H01M 2008/1095; H01M 2008/1293; H01M 8/04029; H01M 8/04014; H01M 8/0289; H01M 8/184; C25B 9/70; C25B 9/67; F28D 2021/0029; F28D 15/0233; F28F 2260/02; G06F 2200/201; G06F 1/206; H05K 7/20272; H05K 7/20263; H05K 7/20281; Y10T 29/49108
See application file for complete search history.

(56) References Cited

U.S. PATENT DOCUMENTS

2004/0152240 A1 8/2004 Dangelo
2004/0190252 A1* 9/2004 Prasher ................ H01L 23/427
165/80.4

(Continued)

FOREIGN PATENT DOCUMENTS

WO 2022038543 A1 2/2022

OTHER PUBLICATIONS

"International Search Report and Written Opinion Issued in PCT Application No. PCT/US23/022463", Mailed Date: Sep. 28, 2023, 13 Pages.

*Primary Examiner* — Michael A Matey
(74) *Attorney, Agent, or Firm* — RAY QUINNEY & NEBEKER P.C.; Paul N. Taylor

(57) ABSTRACT

A processing unit includes a first die and a second die with a microfluidic volume between the first die and the second die. At least one heat transfer structure couples the first die to the second die and is located in the microfluid volume. An electrochemical fluid is positioned in the microfluidic volume to provide electrochemical energy to at least one of the first die and the second die and receive heat from the first die and the second die.

20 Claims, 7 Drawing Sheets

(56) References Cited

U.S. PATENT DOCUMENTS

| | | | |
|---|---|---|---|
| 2004/0258970 A1* | 12/2004 | McLean | H01M 8/1007 |
| | | | 29/890.03 |
| 2007/0114657 A1* | 5/2007 | Dangelo | H01L 23/373 |
| | | | 257/E23.11 |
| 2009/0023036 A1* | 1/2009 | Liu | H01M 8/2455 |
| | | | 429/448 |
| 2009/0087640 A1* | 4/2009 | Li | H05K 7/20981 |
| | | | 428/411.1 |
| 2009/0169941 A1* | 7/2009 | Spink | H01M 8/1011 |
| | | | 429/479 |
| 2018/0241066 A1* | 8/2018 | Ebejer | H01M 8/2465 |
| 2020/0013699 A1* | 1/2020 | Liu | H01L 24/80 |
| 2021/0375716 A1* | 12/2021 | Tadayon | H01L 23/3733 |
| 2022/0123377 A1* | 4/2022 | Brushett | H01M 10/4214 |
| 2022/0399249 A1* | 12/2022 | Dogiamis | H01L 23/5384 |

\* cited by examiner

ULTRA DENSE PROCESSORS WITH EMBEDDED MICROFLUIDIC COOLING

BACKGROUND

Background and Relevant Art

Conventional processing units are powered and cooled by discrete power supplies and cooling systems. As the density of compute resources, such as in server configurations and/or in datacenters, increases, the available space for power delivery and heat removal decreases.

BRIEF SUMMARY

In some embodiments, a processing unit includes a first die and a second die with a microfluidic volume between the first die and the second die. At least one heat transfer structure couples the first die to the second die and is located in the microfluid volume. An electrochemical fluid is positioned in the microfluidic volume to provide electrochemical energy to at least one of the first die and the second die and receive heat from the first die and the second die.

In some embodiments, a computing system includes a first wafer, a second wafer, and a manifold. The first wafer includes a first die and a second die with a first microfluidic volume between the first die and the second die. A first plurality of heat transfer structures couples the first die to the second die and is located in the first microfluid volume. The second wafer includes a third die and a fourth die with a second microfluidic volume between the third die and the fourth die. A second plurality of heat transfer structures couples the third die to the fourth die and is located in the second microfluid volume. The manifold is configured to flow an electrochemical fluid through the first microfluidic volume and the second microfluidic volume. The electrochemical fluid is configured to provide electrical power to the first die and second die and to receive heat from the first plurality of heat transfer structures and the second plurality of heat transfer structures.

In some embodiments, a method of providing power and cooling to a stacked-die processor includes providing an electrochemical fluid to a microfluidic volume of the stacked-die processor, generating electrical power at the stacked-die processor with the electrochemical fluid, receiving heat from the stacked-die processor with the electrochemical fluid in the microfluidic volume, and exhausting the heat from the electrochemical fluid at a heat exchanger.

This Summary is provided to introduce a selection of concepts in a simplified form that are further described below in the Detailed Description. This Summary is not intended to identify key features or essential features of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 1-2 is a diagram of the electrochemical system of FIG. 1-1 with a charging device, according to at least some embodiments of the present disclosure;

FIG. 2 is a side cross-sectional view of a processing unit with electrochemical generation, according to at least some embodiments of the present disclosure;

FIG. 3-1 is a top view of a processing unit with a plurality of fluid channels in a microfluidic volume, according to at least some embodiments of the present disclosure;

FIG. 3-2 is a side view of the processing unit of FIG. 3-1;

DETAILED DESCRIPTION

Figure 1:
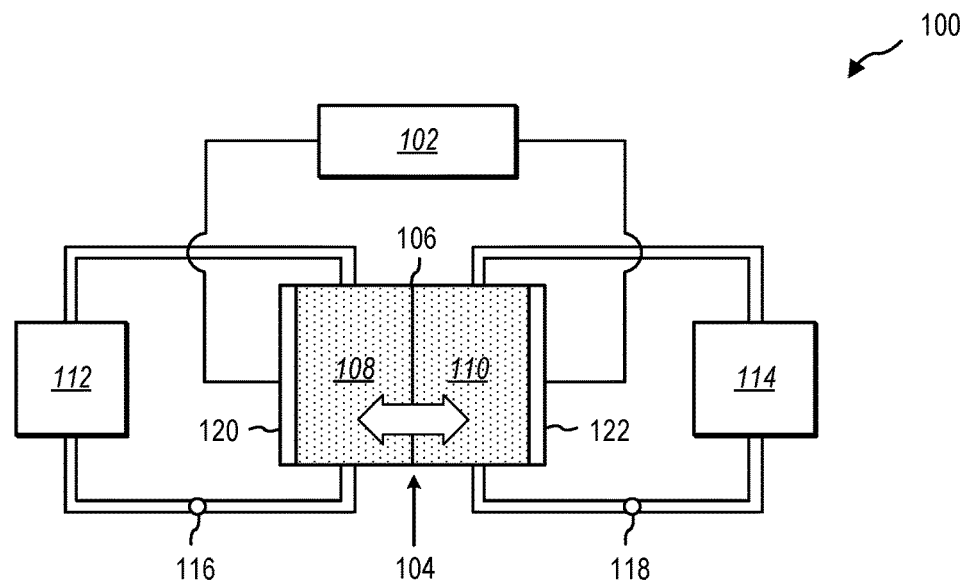
FIG. 1-1 is a diagram of an electrochemical system, according to at least some embodiments of the present disclosure.

The present disclosure generally relates to systems and methods for providing electrical power and thermal management to a processor. More particularly, the present disclosure relates to power generation using an electrochemical fluid in a microfluidic volume between dies of a stacked-die processor with heat exhausted from the microfluidic volume by the electrochemical fluid. A microfluidic volume is a volume between the dies of a stacked-die or three-dimensional processor, which allows a fluid flow through the processor adjacent to or contacting one or more of the dies. In some embodiments, at least a portion of an electrochemical flow battery and/or generator is located in the microfluidic volume between a first die and a second die of the processor. For example, an electrochemical fluid, such as an anolyte or catholyte, flows into the microfluidic volume such that an electrical voltage and current is produced at the first die and/or second die from the electrochemical fluid to power the processor or other component of the stacked-die processor through electrodes connected thereto. The electrochemical fluid receives heat from the first die and/or second die, and the electrochemical fluid flows out of the microfluidic volume to exhaust heat from the processor.

In some embodiments, a heat-generating component according to the present disclosure includes a die. The die may be a generalized device, such as a central processing unit (CPU) or graphical processing unit (GPU), a specialized device application-specific integrating circuit (ASIC), a memory module (such as cache memory, volatile memory, or non-volatile memory), or other electronic or processing components. The die generates heat during use.

In a conventional processor, the die is connected to a printed circuit board (PCB), which delivers electrical power to the die via one or more wire traces. The delivery of electrical power through the wire traces can be inefficient from an electrical standpoint and/or a design space standpoint. Further, conventionally, heat generated by the processor is transmitted by a thermal interface material (TIM) to a heat spreader that is in contact with a heat sink or other interface to exhaust the heat to a liquid coolant or to the ambient atmosphere. In some instances, the thermal management components and interfaces can limit the amount of heat exhausted. In the case of stacked-die processors, conventional thermal management may be incapable of cooling all dies in the processor.

In some embodiments, a stacked-die processor includes at least a first die and a second die stacked with pin fins or other heat transfer structures therebetween. In some embodiments, the heat transfer structures contain through silicon vias (TSVs) therein to electrically connect the first die and second die. In some examples, a first microfluidic volume is located between the first die and the second die, and a first set of pin fins couples the first die and the second die through the first microfluidic volume. In some embodiments, a second microfluidic volume is located between the second die and the third die, and a second set of pin fins couples the second die and the third die through the second microfluidic volume.

In some embodiments, an electrochemical fluid (such as a Vanadium salt) positioned in the microfluidic volume allows each die to receive power from the electrochemical fluid, directly. The on-chip power generation of the electrochemical fluid may limit and/or eliminate the need for electrical power delivery by TSVs. In at least one embodiment, data communication between the dies of the processor may be increased by limiting and/or eliminate the need for electrical power delivery by TSVs, providing additional space for TSVs between the logic units of the dies. Further, direct power delivery and/or thermal management of the electrochemical fluid may allow for more efficient power delivery and/or thermal management.

In some embodiments, the electrochemical fluid is urged through the first microfluidic volume and through the second microfluidic volume at the same flow rate. For example, a manifold forming at least a portion of the side wall of the microfluidic volumes may be connected to an inlet conduit may provide equal flow rate and/or equal fluid pressure to both the first microfluidic volume and the second microfluidic volume. In some embodiments, the flow rate is different, such as when different thermal management or power delivery is required by different portions of the stacked-die processor. For example, a first inlet conduit may provide a first flow rate and/or fluid pressure to the first microfluidic volume and a second inlet conduit may provide a second flow rate and/or fluid pressure to the second microfluidic volume.

While some embodiments described herein have a plurality of dies that are the same area, in other embodiments, at least one die of a stacked-die processor has a different shape or area than another die in the stacked-die processor. In some embodiments, a stacked-die processor includes dies of varying sizes. In one example, first die and second die (such as a CPU and GPU) have substantially the same area, while a third die (such as memory) has a different area. In some embodiments, different dies may have the same in-plane aspect ratio and have different areas, such as two different size squares. In some embodiments, different dies may have different in-plane aspect ratios and have the same area, such as two rectangles turned 90° relative to one another. In some embodiments, different dies may have different areas but share at least one dimension of their area, such as the second die and third die having different lengths in the direction of flow but having equal widths perpendicular to the direction of flow. In another example, the first die and the second die may have equal lengths in the direction of flow but having different widths perpendicular to the direction of flow.

Different size dies may have different thermal management requirements associated with a given electrical power delivery. In some embodiments, a first set of heat transfer structures and a second set of heat transfer structures have different heat transfer surface features (HTSFs) thereon. For example, a first set of heat transfer structures may have a HTSF thereon and the second set of heat transfer structures may lack a HTSF or have a different HTSF thereon. In other examples, the first set of heat transfer structures may have a plurality of recesses in a surface thereof, and the second set of heat transfer structures may lack recesses in a surface thereof or have recesses in a different pattern or with different dimensions. In other examples, the first set of heat transfer structures may have a plurality of protrusions on a surface thereof, and the second set of heat transfer structures may lack protrusions on a surface thereof or have protrusions in a different pattern or with different dimensions. In some embodiments, the thermal management requires of the dies may be different, and the HTSF of the first set of heat transfer structures and the second set of heat transfer structures may be different to effect the different thermal management properties.

In some embodiments, combined electrical power delivery and thermal management by electrochemical fluids in a microfluidic volume according to the present disclosure allows for an increased density of processors in computing device, a server blade, a server rack, or a datacenter. For example, on-chip power delivery and cooling may allow for a dense stack of wafers with stacked-die processors that are not possible with conventional PCB power delivery and separate thermal management.

FIG. 1 is a schematic view of an electrochemical generation system 100 to provide electrical power to an electrical load 102 (e.g., a processor) or from an electrical source. In some embodiments, an electrochemical generation system 100 includes an electrochemical chamber 104 with an ion-transfer membrane 106 dividing the electrochemical chamber 104. The electrochemical chamber 104 includes a first electrochemical fluid 108 and a second electrochemical fluid 110 separated by the ion-transfer membrane 106. In some embodiments, ion-transfer across the ion-transfer membrane 106 between the first electrochemical fluid 108 and the second electrochemical fluid 110 produces an electric voltage and current to the processor or other electrical load 102 and discharges the first electrochemical fluid 108. In some embodiments, an applied voltage from an electrical source (in place of the electrical load) results in a reverse transfer of ions across the ion-transfer membrane 106 which charges the first electrochemical fluid 108.

In some embodiments, the electrochemical chamber 104 is in fluid communication with a first storage tank 112 and a second storage tank 114. For example, the first electrochemical fluid 108 is stored in the first storage tank 112 and can flow into the electrochemical chamber 104, and the second electrochemical fluid 110 is stored in the second storage tank 114 and can flow into the electrochemical chamber 104. A first pump 116 and second pump 118 may control the flow of the first electrochemical fluid 108 and the flow of the second electrochemical fluid 110, respectively to the electrochemical chamber 104. In some embodiments, the rate of ion-transfer across the ion-transfer membrane 106 is at least partially related to a flow rate of the first electrochemical fluid 108 and the second electrochemical fluid 110 into the electrochemical chamber 104 (and in contact with the ion-transfer membrane 106).

The electrical charge produced by the ion transfer across the ion-transfer membrane 106 may be collected at a first electrode 120 and a second electrode 122 positioned in or on the electrochemical chamber 104 on opposite sides of the ion-transfer membrane 106. For example, a first electrode 120 is in contact with the first electrochemical fluid 108 and a second electrode 122 is in contact with the second electrochemical fluid 110. The electrodes 120, 122 collect charge from the first electrochemical fluid 108 and the second electrochemical fluid 110. In some embodiments, the first electrochemical fluid 108 in an anolyte fluid, and the second electrochemical fluid 110 is a catholyte fluid. In some embodiments, the anolyte fluid and the catholyte fluid is the same fluid or compound in different states of charge. In at least one embodiment, the anolyte fluid and the catholyte fluid are or include a Vanadium salt.

Figures 1, 2:
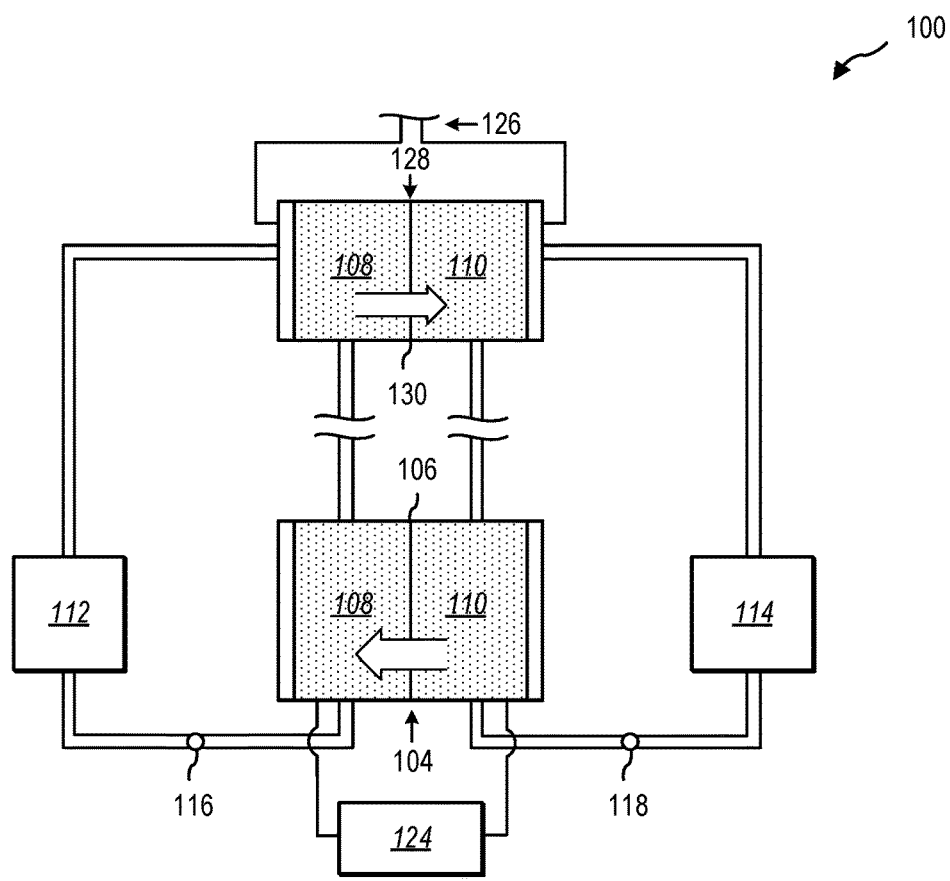
Figure 2:
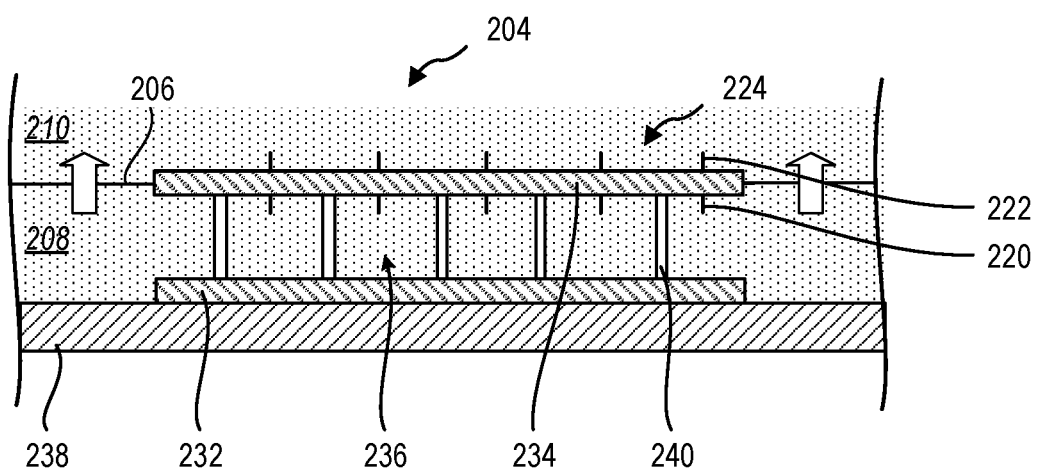

FIG. 1-2 is a schematic illustration of the electrochemical generator system 100 of FIG. 1-1 with a processor 124 as the electrical load and a separate electrical source 126 connected to a second electrochemical chamber 128. In some embodiments, an electrochemical generator system 100 includes a first electrochemical chamber 104 configured to discharge an electrochemical fluid and provide an electrical power to an electrical load (e.g., the processor 124), and the electrochemical generator system 100 includes a second electrochemical chamber 128 configured to receive electrical power from an electrical source 126 (e.g., a power grid or other power source) to recharge the electrochemical fluid 108, 110.

In some embodiments, the electrochemical fluid 108, 110 circulates through the electrochemical generator system 100, receiving electrical power from the electrical source 126 and delivering the electrical power to the electrical load, substantially continuously. In some embodiments, the electrochemical fluid 108, 110 is stored in a storage tank 112, 114 until the electrical power is needed similarly to a battery, when pumps 116, 118 flow the electrochemical fluid 108, 110. As described in relation to FIG. 1-1, a first electrochemical fluid 108 and a second electrochemical fluid 110 exchange ions across a first ion-transfer membrane 106 in the first electrochemical chamber 104 to discharge the first electrochemical fluid 108 and produce electrical power. The first electrochemical fluid 108 and a second electrochemical fluid 110 exchange ions across a second ion-transfer membrane 130 in the second electrochemical chamber 128 to charge the first electrochemical fluid 108 and store electrical power.

In some embodiments, at least a part of the electrochemical chamber configured to provide power is located in a microfluidic volume between dies on a stacked-die processor. For example, a first electrochemical fluid may be positioned in the microfluidic volume. In another example, a second electrochemical fluid may be positioned in the microfluidic volume. In yet another example, both the first electrochemical fluid and the second electrochemical fluid may be positioned in the microfluidic volume.

FIG. 2 is a side cross-sectional view of a processor 224 with a first die 232 and a second die 234 with a microfluidic volume 236 positioned therebetween. In some embodiments, a minimum distance between the first die 232 and the second die 234 may be less than 100 microns. In some embodiments, a minimum distance between the first die 232 and the second die 234 may be less than 200 microns. In some embodiments, a minimum distance between the first die 232 and the second die 234 may be less than 300 microns. In some embodiments, a distance between the first die 232 and the second die 234 is substantially constant across the microfluidic volume 236. For example, the surfaces of the first die 232 and second die 234 that are proximate one another may be substantially planar and parallel. In other embodiments, at least a portion of the surfaces of the first die 232 and second die 234 that are proximate one another is non-planar, and a minimum distance between the first die 232 and second die 234 is defined by the location on the surfaces of the first die 232 and second die 234 that are closest to one another.

In some embodiments, the microfluidic volume 236 of the processor 224 is part of the electrochemical chamber 204 configured to provide electrical power through the discharge of the first electrochemical fluid 208 to the second electrochemical fluid 210. For example, an ion transfer across the ion-transfer membrane 206 may generate an electrical potential between the first electrode(s) 220 and the second electrode(s) 222. In at least one example, the first electrochemical fluid 208 is positioned in the microfluidic volume 236 on a first side of the second die 234 and the second electrochemical fluid 210 is positioned on a second side of the second die 234, with the ion-transfer membrane 206 positioned between the first electrochemical fluid 208 and the second electrochemical fluid 210. The second die 234 may be positioned between the first electrodes 220 and second electrodes 222 to receive the electrical power. For example, the first electrochemical fluid 208 may be an anolyte and the second electrochemical fluid 210 may be a catholyte such that the second die 234 (and the circuits thereof) are positioned as the electrical load between the first electrodes 220 in contact with the anolyte and the second electrodes 222 in contact with the catholyte.

In some embodiments, the processor 224 is connected to a conventional PCB 238. In some embodiments, the processor 224 is integrally formed with a silicon wafer. For example, a first die 232 may be integrally formed with a silicon wafer. The first die 232 and the second die 234, separated by the microfluidic volume 236, may be connected by one or more heat transfer structures 240 positioned between the first die 232 and the second die 234. In some embodiments, the heat transfer structures 240 are configured to transfer heat from the first die 232 and/or the second die 234 to the first electrochemical fluid 208 and/or the second electrochemical fluid 210 positioned in the microfluidic volume 236.

While some processors according to the present disclosure have a first electrochemical fluid positioned in the microfluidic volume and a second electrochemical fluid positioned outside of the microfluidic volume, other embodiments of a processor have both the first electrochemical fluid and the second electrochemical fluid positioned in the microfluidic volume. For example, an ion-transfer membrane is positioned in the microfluidic volume to separate the first electrochemical fluid and the second electrochemical fluid. In at least one embodiment, the ion-transfer membrane is a heat transfer structure that allows the movement of ions across and heat through the membrane.

Figures 1, 3:
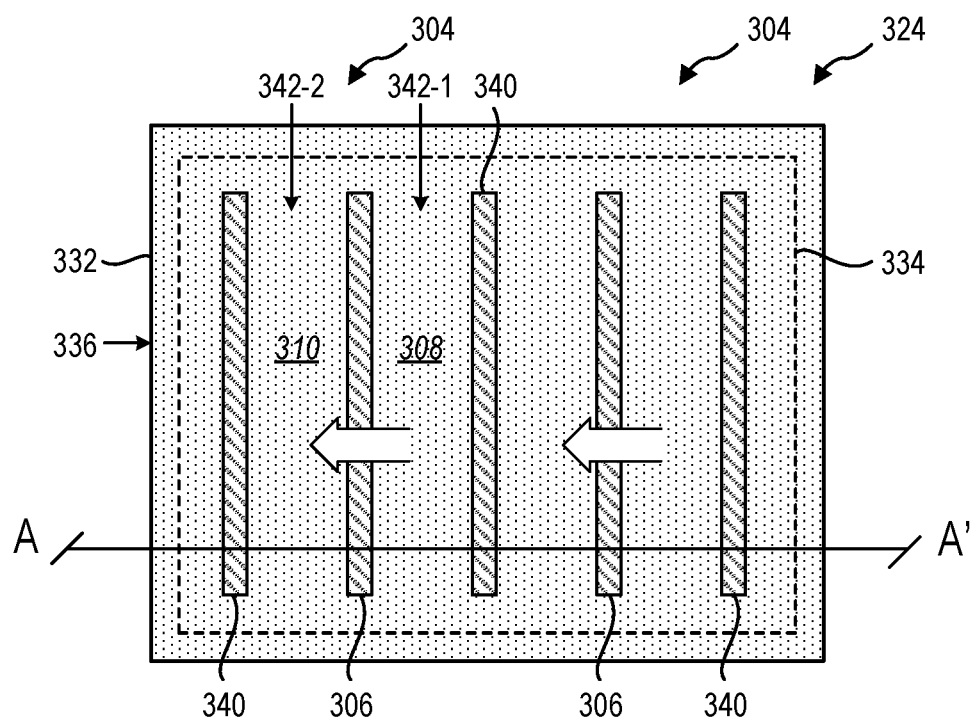
Figures 2, 3:
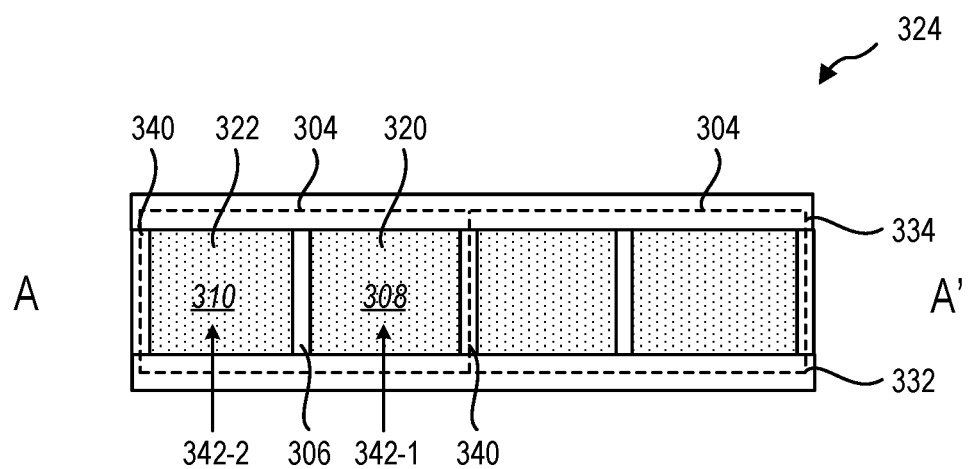

FIG. 3-1 is a top view of an embodiment of a processor 324 with a plurality of heat transfer structures 340 positioned in a microfluidic volume 336 between a first die 332 and a second die 334 (the second die 334 is shown in outline in FIG. 3-1). In some embodiments, at least one of the heat transfer structures 340 is also an ion-transfer membrane. In some embodiments, at least one ion-transfer membrane 306 is located in the microfluidic volume in addition to the heat transfer structures 340. For example, the heat transfer structures 340 and ion-transfer membrane(s) 306 may divide the microfluidic volume 336 into a plurality of channels 342-1, 342-2. In some embodiments, at least some adjacent channels 342-1, 342-2 have a first electrochemical fluid 308 therein and a second electrochemical fluid 310 therein, respectively, to allow ion transfer across the ion-transfer membrane 306.

In FIG. 3-1, heat transfer structures 340 are straight fins that define two electrochemical chambers adjacent to one another, which are each divided by ion-transfer membranes 306 positioned therein to create a first channel 342-1 and a second channel 342-2 in each electrochemical chamber 304. In some embodiments, the electrochemical chambers 304 allow flow of the first electrochemical fluid 308 in the first channel 342-1 and the second electrochemical fluid 310 in the second channel 342-2. In other examples, at least part of the heat transfer structure 340 may be curved or have a curved portion. For example, a first heat transfer structure 340 may be curved relative to another heat transfer structure 340 such that the cross-sectional area of a channel 342-1, 342-2 varies in a flow direction of the electrochemical fluid. In at least one embodiment, the cross-sectional area of a channel 342-1, 342-2 increases in the direction of flow to decrease the velocity of the electrochemical fluid through the channel 342-1, 342-2. In at least one embodiment, the cross-sectional area of a channel 342-1, 342-2 decreases in the direction of flow to increase the velocity of the electrochemical fluid through the channel 342-1, 342-2.

FIG. 3-2 illustrates a transverse cross-sectional view of the processor 324 of FIG. 3-1 through the line A-A' showing the electrochemical chambers 304. The first electrochemical fluid 308 in the first channel 342-1 separated from the second electrochemical fluid 310 in the second channel 342-2 by an ion-transfer membrane 306 creates an electric potential between the first electrode(s) 320 position in the first channel 342-1 and the second electrode(s) 322 positioned in the second channel 342-2. In some embodiments, both the first die 332 and the second die 334 have electrodes 320, 322 positioned in contact with one or more of the first electrochemical fluid 308 and the second electrochemical fluid 310. The first die 332 and second die 334 can, therefore, both receive electrical power from the electrochemical fluids 308, 310 while the electrochemical fluids 308, 310 receive heat from the first die 332 and second die 334 to exhaust the heat therefrom. In some embodiments, the heat transfer structures 340 further transfer heat to the electrochemical fluids 308, 310. In some embodiments, at least one of the ion-transfer membranes 306 is a heat transfer structure 340.

Figure 4:
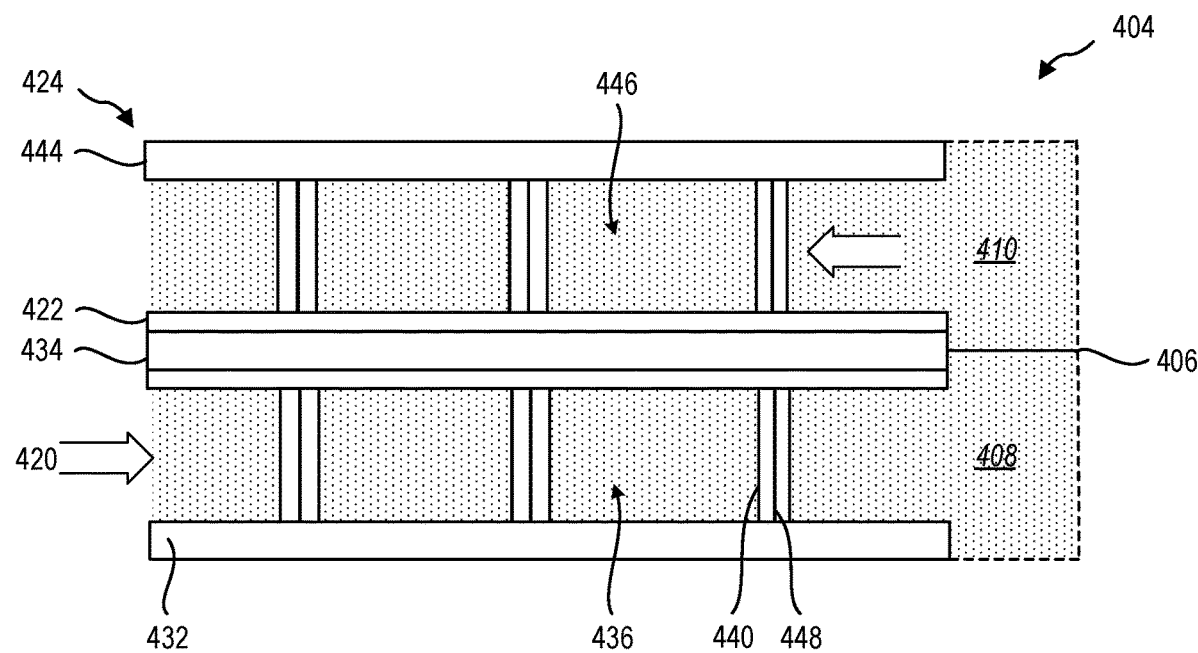
FIG. 4 is a side view of a processing unit with electrochemical fluid in a plurality of microfluidic volumes, according to at least some embodiments of the present disclosure.

FIG. 4 is a side view of another embodiment of a stacked-die processor 424 with a first die 432, a second die 434, and a third die 444. In some embodiments, a first microfluidic volume 436 is located between the first die 432 and the second die 434, and a second microfluidic volume 446 is located between second die 434 and the third die 444. In some embodiments, a first electrochemical fluid 408 is located in the first microfluidic volume 436 and a second electrochemical fluid 410 is located in the second microfluidic volume 446. The first microfluidic volume 436 and the second microfluidic volume 446 form at least part of an electrochemical chamber 404 that is divided by the second die 434 and an ion-transfer membrane 406. In some embodiments, a first electrode 420 and a second electrode 422 contacting the first electrochemical fluid 408 and the second electrochemical fluid 410, respectively, allows the electrochemical chamber 404 to provide electrical power to at least the second die 434. In some embodiments, one or more TSVs 448 located in heat transfer structures 440 or other structures between the second die 434 and the first die 432 and/or third die 444 can transmit electrical power from the electrodes 420, 422 to different parts of the processor 424.

In some embodiments, a flow direction of the first electrochemical fluid 408 and the second electrochemical fluid 410 are oriented in the same direction relative to the processor 424. In some embodiments, the flow direction of the first electrochemical fluid 408 and the second electrochemical fluid 410 are oriented different directions relative to the processor 424. For example, FIG. 4 illustrates a flow direction of the first electrochemical fluid 408 to be opposite a flow direction of the second electrochemical fluid 410 relative to the processor 424. In some examples, orienting the flow directions opposite one another may allow the first electrochemical fluid 408 and second electrochemical fluid 410 to more efficiently receive heat from the dies 432, 434, 444 and/or heat transfer structures 440 of the stacked-die processor 424 and cool the stacked-die processor 424.

Figure 5:
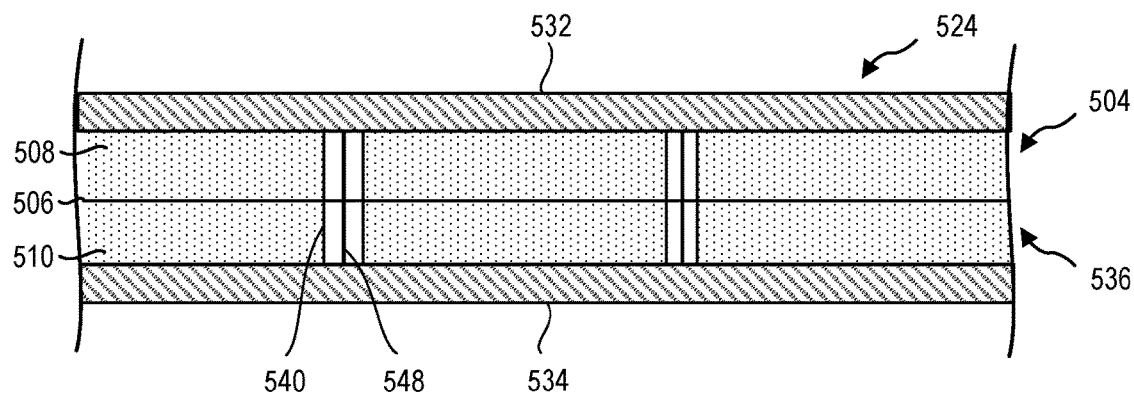
FIG. 5 is a side view of a processing unit with an ion-transfer membrane in a microfluidic volume, according to at least some embodiments of the present disclosure.

FIG. 5 is a side view of an embodiment of a stacked-die processor with an ion-transfer membrane 506 located in the microfluidic volume and co-planar with the first die 532 and the second die 534. In some embodiments, the microfluidic volume 536 between the first die 532 and the second die 534 defines at least a portion of the electrochemical chamber 504. An ion-transfer membrane 506 divides the microfluidic volume 536 and separates the first electrochemical fluid 508 from the second electrochemical fluid 510. In some embodiments, electrodes (not illustrated in FIG. 5) receive the electrical power produced by the ion transfer across the ion-transfer membrane 506, and the TSVs 548 electrically connect the first die 532 and the second die 534 may conduct electricity therebetween.

Figure 6:
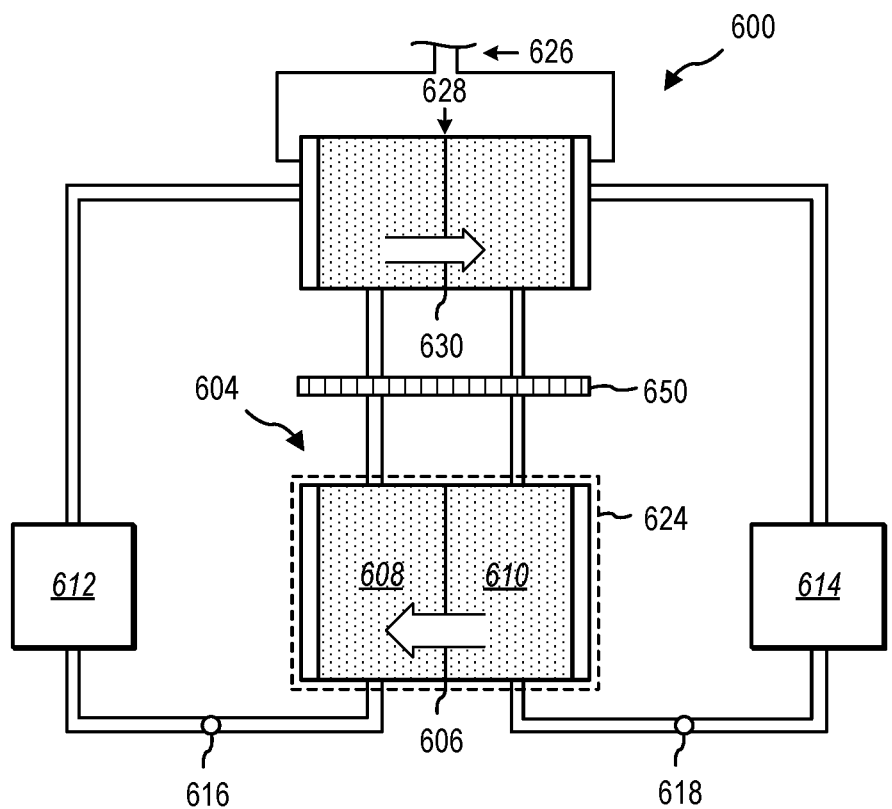
FIG. 6 is a system diagram of an electrochemical system with a heat exchanger, according to at least some embodiments of the present disclosure.

FIG. 6 is a schematic view of an embodiment of an electrochemical generator system 600 including a heat exchanger 650. In some embodiments, an electrochemical generator system 600 includes a first electrochemical chamber 604 configured to discharge an electrochemical fluid and provide an electrical power to an electrical load (e.g., the processor 624), and the electrochemical generator system 600 includes a second electrochemical chamber 628 configured to receive electrical power from an electrical source 626 (e.g., a power grid or other power source) to recharge the electrochemical fluid 608, 610.

In some embodiments, the electrochemical fluid 608, 610 circulates through the electrochemical generator system 600, receiving electrical power from the electrical source 626 and delivering the electrical power to the electrical load, substantially continuously. In some embodiments, the electrochemical fluid is stored in a storage tank 612, 614 until the electrical power is needed similarly to a battery, when pumps 616, 618 flow the electrochemical fluid 608, 610. A first electrochemical fluid 608 and a second electrochemical fluid 610 exchange ions across a first ion-transfer membrane 606 in the first electrochemical chamber 604 to discharge the first electrochemical fluid 608 and produce electrical power. The first electrochemical fluid 608 and a second electrochemical fluid 610 exchange ions across a second ion-transfer membrane 630 in the second electrochemical chamber 628 to charge the first electrochemical fluid 608 and store electrical power.

In some embodiments, at least a part of the electrochemical chamber configured to provide power is located in a microfluidic volume between dies on a stacked-die processor as illustrated and described in relation to any of FIG. 3-1 through FIG. 5. For example, a first electrochemical fluid may be positioned in the microfluidic volume. In another example, a second electrochemical fluid may be positioned in the microfluidic volume. In yet another example, both the first electrochemical fluid and the second electrochemical fluid may be positioned in the microfluidic volume.

The first electrochemical fluid 608 and second electrochemical fluid 610 may receive heat from the stacked-die processor 624 or other heat-generating component of the electrochemical generator system 600. The first electrochemical fluid 608 and second electrochemical fluid 610 may flow from the stacked-die processor 624 (e.g., a microfluidic volume of the stacked die processor 624) or other heat-generating component to the heat exchanger 650 and exhaust at least a portion of the heat from the first electrochemical fluid 608 and second electrochemical fluid 610. The first electrochemical fluid 608 and second electrochemical fluid 610 can thereby provide electrical power directly to the processor 624 and remove heat from the processor 624 in a single medium passing through the microfluidic volume of the processor 624.

Figure 7:
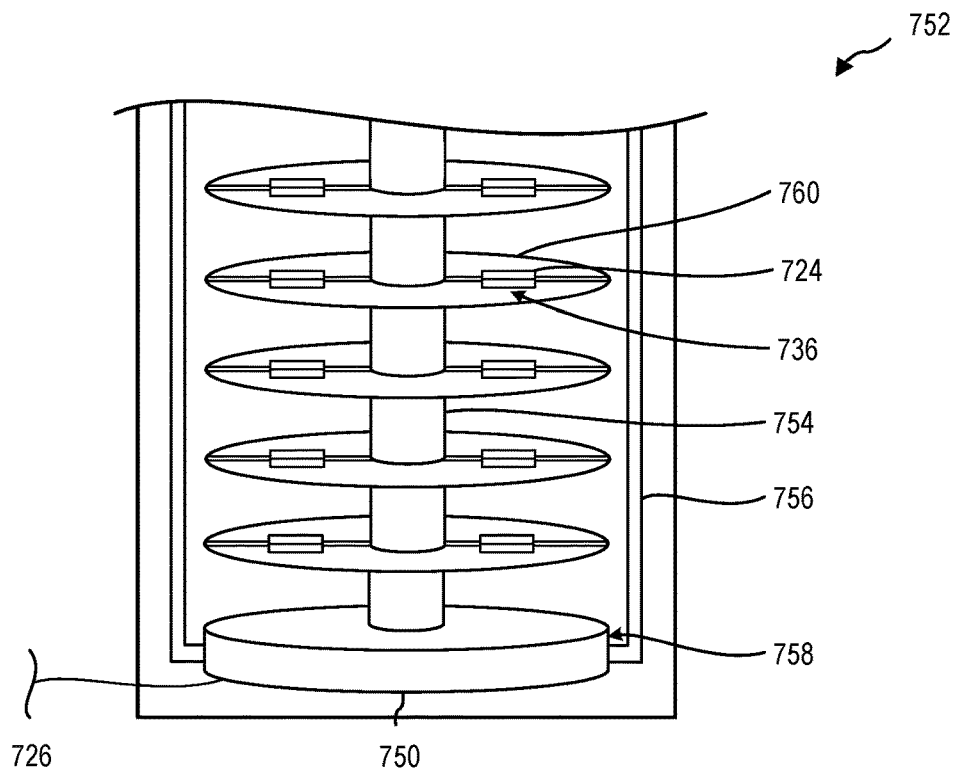
FIG. 7 is a system diagram of a server stack with on-chip power generation and cooling, according to at least some embodiments of the present disclosure.

The combined electrical power delivery and cooling in the microfluidic volume of stacked-die processors allows, in some embodiments, for increased density of processors. For example, FIG. 7 is a side cross-sectional view of an embodiment of a server stack 752 with electrochemical power generation and cooling in the microfluidic volumes 736 of the processors 724. The server stack 752 includes a plurality of wafers 760 with stacked-die processors 724 located thereon. For example, the stacked die processors 724 may be integrally formed with a wafer 760 with a microfluidic volume 736 in the stacked-die processor 724 formed in the material (e.g., silicon) of the wafer 760.

In some embodiments, the microfluidic volume 736 receives one or more electrochemical fluids from a manifold 754 or other delivery element of the server stack 752 that directs charged electrochemical fluid to the stacked-die processor to provide electrical power as described in relation to any of the embodiments described herein. The electrochemical fluid(s) discharges at the stacked-die processor 724 to provide electrical power and receives heat from the stacked-die processor 724. The discharged and hot electrochemical fluid flows through a return conduit 756 to a charging device 758 to recharge the electrochemical fluid with energy from a power source 726. In some embodiments, the charging device 758 includes a heat exchanger 750 to exhaust the heat from the electrochemical fluid. In some embodiments, the heat exchanger 750 exhausts heat from the electrochemical fluid to the ambient atmosphere. In some embodiments, the heat exchanger 750 exhausts heat from the electrochemical fluid to another cooling fluid, such as in a secondary liquid cooling system.

Figure 8:
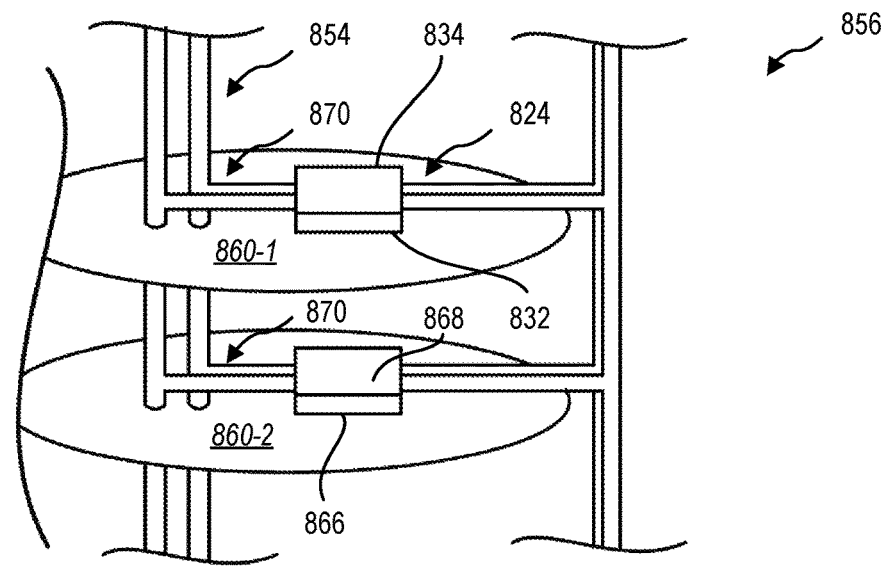
FIG. 8 is a detail view of the manifold and processing units of a server stack, according to at least some embodiments of the present disclosure.

FIG. 8 is a side view of an embodiment of a manifold 854 configured to deliver electrochemical fluid to a portion of a server stack, such as the server stack 752 illustrated in FIG. 7. In some embodiments, the manifold 854 includes an anolyte delivery conduit 862 (e.g., tube or pipe) configured to deliver an anolyte fluid to a plurality of wafers 860-1, 860-2 of the server stack. The manifold 854 further includes a catholyte delivery conduit 864 configured to deliver a catholyte fluid to a plurality of wafers 860-1, 860-2 of the server stack. In at least one embodiment, the manifold 854 includes capillary conduits 870 that connect the anolyte delivery conduit 862 and the catholyte delivery conduit 864 to the microfluidic volume of the stacked-die processors.

In some examples, a first wafer 860-1 includes a processor with a first die 832 and a second die 834 and a second processor with a third die 866 and a fourth die 868. The capillary conduits 870 are configured to deliver the anolyte fluid and the catholyte fluid from the manifold 854 to the first microfluidic volume between the first die 832 and the second die 834 and to the second microfluidic volume between the third die 866 and the fourth die 868. In some embodiments, the microfluidic volumes each include an ion-transfer membrane such that the microfluidic volume is an electrochemical chamber as described in relation to any of the embodiments described herein. In some embodiments, the microfluidic volumes each include a heat transfer structure connecting the dies to one another to transfer heat from the dies to the electrochemical fluid(s) as described in relation to any of the embodiments described herein. In some embodiments, the microfluidic volumes each include TSVs to electrically connect the dies to one another as described in relation to any of the embodiments described herein. In at least one embodiment, at least one of the TSVs is located in the heat-transfer structure(s) positioned in the microfluidic volume. For example, the heat-transfer structures may include straight fins that divide the microfluidic volumes into channels, and the TSVs may be positioned in the straight fins to allow electrical connection between the dies of each stacked-die processor.

After at least partially discharging in the microfluidic volume, the electrochemical fluids (e.g., the anolyte fluid and the catholyte fluid) flow from the stacked-die processor 824 to the return conduit, where the discharged electrochemical fluids flow toward a charging device to recharge the electrochemical fluids with energy from a power source and/or a heat exchanger to exhaust the heat from the electrochemical fluids.

In some embodiments, the manifold 854 flows electrochemical fluid from the manifold 854, through the microfluidic volumes, to the return conduit 856 in an outward direction of the server stack. For example, the manifold 854 may be a central manifold 854 that flows electrochemical fluid radially outward from the central manifold 854. In some embodiments, the manifold 854 flows electrochemical fluid radially outward in a first wafer 860-1 and radially inward on a second wafer 860-2. For example, counterflow of the electrochemical fluid on different wafers 860-1, 860-2 may distribute heat more evenly throughout the server stack and reduce areas of concentrated heat. In at least one example, a first manifold is a central manifold in a center of the wafers, and a second manifold is a radial manifold that is located at a radially outward position.

Figure 9:
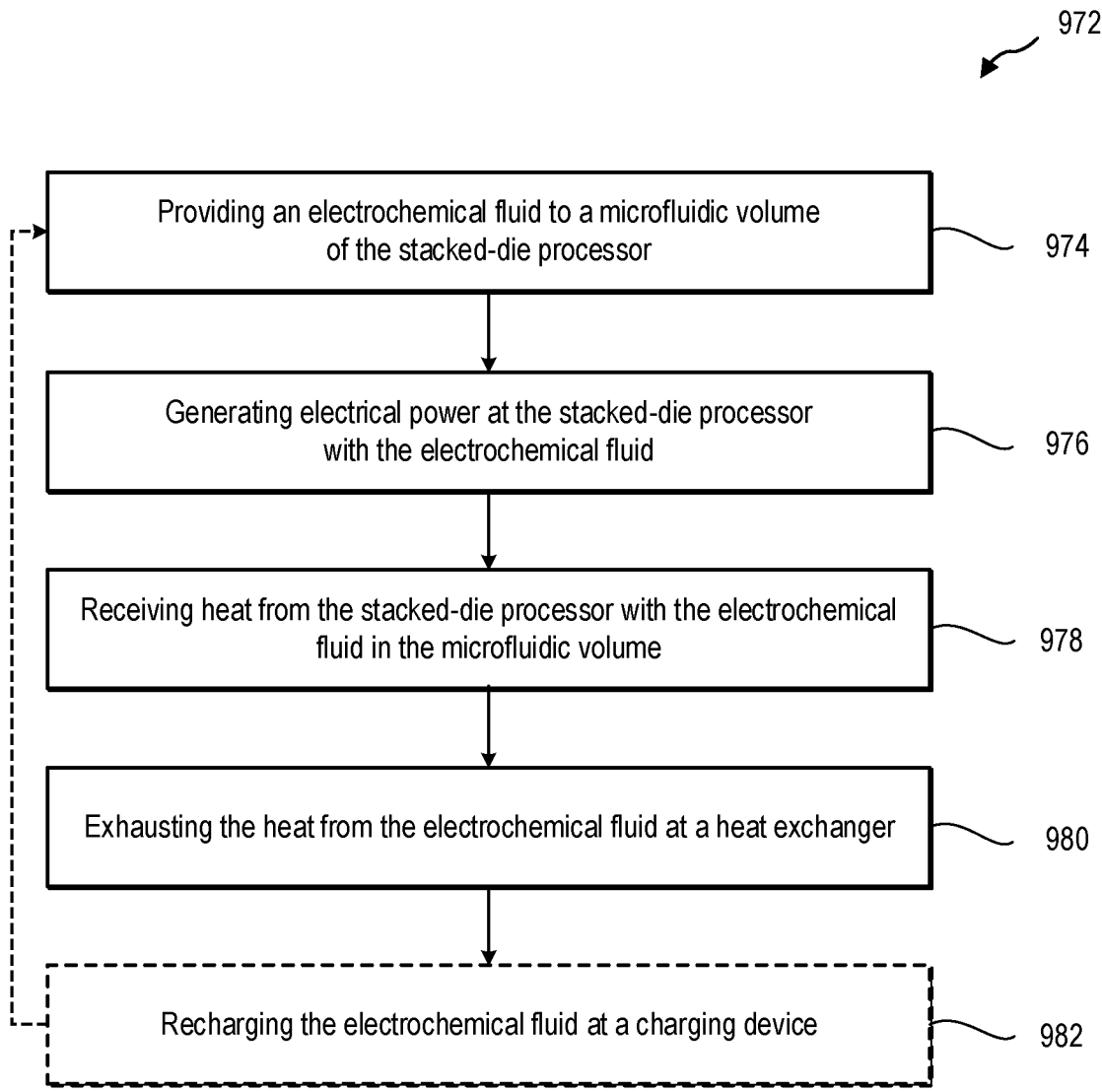
FIG. 9 is a flowchart illustrating a method of combined power delivery and thermal management for a stacked-die processor, according to at least some embodiments of the present disclosure.

FIG. 9 is a flowchart illustrating a method 972 of power delivery and thermal management in a stacked-die processor. In some embodiments, the method 972 includes providing an electrochemical fluid to a microfluidic volume of the stacked-die processor at 974. In some embodiments, the electrochemical fluid includes an anolyte fluid. In some embodiments, the electrochemical fluid includes a catholyte fluid. In some embodiments, the electrochemical fluid includes both an anolyte fluid and a catholyte fluid.

The method 972 further includes generating electrical power at the stacked-die processor with the electrochemical fluid at 976. For example, generating electrical power at the stacked-die processor may include discharging an anolyte fluid in the microfluidic volume. In other examples, generating electrical power at the stacked-die processor may include receiving ions with a catholyte fluid in the microfluidic volume. In yet other examples, generating electrical power at the stacked-die processor may include transferring ions across an ion-transfer membrane located in the microfluidic volume. In some embodiments, generating electrical power at the stacked-die processor includes receiving electrical charge at one or more electrodes located in the microfluidic volume.

The method 972, in some embodiments, further includes receiving heat from the stacked-die processor with the electrochemical fluid in the microfluidic volume at 978. For example, the electrochemical fluid may contact and/or receive heat from a first die, a second die, a heat transfer structure connected to the first die and/or second die, or other parts of the stacked-die processor when located in the microfluidic volume. The heat received by the electrochemical fluid cools the stacked-die processor and the method includes exhausting the heat from the electrochemical fluid at a heat exchanger at 980.

In some embodiments, the method 972 further includes recharging the electrochemical fluid at a charging device at 982. In some embodiments, the electrochemical fluid is recharged before exhausting the heat at the heat exchanger. In some embodiments, the electrochemical fluid is recharged after exhausting the heat at the heat exchanger. In some embodiments, the electrochemical fluid is recharged while exhausting the heat at the heat exchanger. For example, the charging device may include a heat exchanger therein.

Recirculating the recharged and cooled electrochemical fluid can allow the electrochemical fluid to provide electrical power and thermal management directly to the dies of a stacked-die processor substantially continuously. In at least one embodiment, delivery of electrochemical fluid to the microfluidic volume of a stacked-die processor can allow combined power delivery and thermal management and allow for smaller, more powerful, more efficient, and more reliable processors.

INDUSTRIAL APPLICABILITY

The present disclosure generally relates to systems and methods for providing electrical power and thermal management to a processor. More particularly, the present disclosure relates to power generation using an electrochemical fluid in a microfluidic volume of a stacked-die processor with heat exhausted from the microfluidic volume by the electrochemical fluid. In some embodiments, at least a portion of an electrochemical flow battery and/or generator is located in the microfluidic volume between a first die and a second die of the processor. For example, an electrochemical fluid, such as an anolyte or catholyte, flows into the microfluidic volume such that an electrical voltage and current is produced at the first die and/or second die from the electrochemical fluid to power the processor or other component of the stacked-die processor. The electrochemical fluid receives heat from the first die and/or second die, and the electrochemical fluid flows out of the microfluidic volume to exhaust heat from the processor.

In some embodiments, a heat-generating component according to the present disclosure includes a die. The die may be a generalized device, such as a central processing unit (CPU) or graphical processing unit (GPU), a specialized device application-specific integrating circuit (ASIC), a memory module (such as cache memory, volatile memory, or non-volatile memory), or other electronic or processing components. The die generates heat during use.

In a conventional processor, the die is connected to a printed circuit board (PCB), which delivers electrical power to the die via one or more wire traces. The delivery of electrical power through the wire traces can be inefficient from an electrical standpoint and/or a design space standpoint. Further, conventionally, heat generated by the processor is transmitted by a thermal interface material (TIM) to a heat spreader that is in contact with a heat sink or other interface to exhaust the heat to a liquid coolant or to the ambient atmosphere. In some instances, the thermal management components and interfaces can limit the amount of heat exhausted. In the case of stacked-die processors, conventional thermal management may be incapable of cooling all dies in the processor.

In some embodiments, a stacked-die processor includes at least a first die and a second die stacked with pin fins or other heat transfer structures therebetween. In some embodiments, the heat transfer structures contain through silicon vias (TSVs) therein to electrically connect the first die and second die. In some examples, a first microfluidic volume is located between the first die and the second die, and a first set of pin fins couples the first die and the second die through the first microfluidic volume. In some embodiments, a second microfluidic volume is located between the second die and the third die, and a second set of pin fins couples the second die and the third die through the second microfluidic volume.

In some embodiments, an electrochemical fluid (such as a Vanadium salt) positioned in the microfluidic volume allows each die to receive power from the electrochemical fluid, directly. The on-chip power generation of the electrochemical fluid may limit and/or eliminate the need for electrical power delivery by TSVs. In at least one embodiment, data communication between the dies of the processor may be increased by limiting and/or eliminate the need for electrical power delivery by TSVs, providing additional space for TSVs between the logic units of the dies. Further, direct power delivery and/or thermal management of the electrochemical fluid may allow for more efficient power delivery and/or thermal management.

In some embodiments, the electrochemical fluid is urged through the first microfluidic volume and through the second microfluidic volume at the same flow rate. For example, a manifold forming at least a portion of the side wall of the microfluidic volumes may be connected to an inlet conduit may provide equal flow rate and/or equal fluid pressure to both the first microfluidic volume and the second microfluidic volume. In some embodiments, the flow rate is different, such as when different thermal management or power delivery is required by different portions of the stacked-die processor. For example, a first inlet conduit may provide a first flow rate and/or fluid pressure to the first microfluidic volume and a second inlet conduit may provide a second flow rate and/or fluid pressure to the second microfluidic volume.

While some embodiments described herein have a plurality of dies that are the same area, in other embodiments, at least one die of a stacked-die processor has a different shape or area than another die in the stacked-die processor. In some embodiments, a stacked-die processor includes dies of varying sizes. In one example, first die and second die (such as a CPU and GPU) have substantially the same area, while a third die (such as memory) has a different area. In some embodiments, different dies may have the same in-plane aspect ratio and have different areas, such as two different size squares. In some embodiments, different dies may have different in-plane aspect ratios and have the same area, such as two rectangles turned 90° relative to one another. In some embodiments, different dies may have different areas but share at least one dimension of their area, such as the second die and third die having different lengths in the direction of flow but having equal widths perpendicular to the direction of flow. In another example, the first die and the second die may have equal lengths in the direction of flow but having different widths perpendicular to the direction of flow.

Different size dies may have different thermal management requirements associated with a given electrical power delivery. In some embodiments, a first set of heat transfer structures and a second set of heat transfer structures have different heat transfer surface features (HTSFs) thereon. For example, a first set of heat transfer structures may have a HTSF thereon and the second set of heat transfer structures may lack a HTSF or have a different HTSF thereon. In other examples, the first set of heat transfer structures may have a plurality of recesses in a surface thereof, and the second set of heat transfer structures may lack recesses in a surface thereof or have recesses in a different pattern or with different dimensions. In other examples, the first set of heat transfer structures may have a plurality of protrusions on a surface thereof, and the second set of heat transfer structures may lack protrusions on a surface thereof or have protrusions in a different pattern or with different dimensions. In some embodiments, the thermal management requires of the dies may be different, and the HTSF of the first set of heat transfer structures and the second set of heat transfer structures may be different to effect the different thermal management properties.

In some embodiments, combined electrical power delivery and thermal management by electrochemical fluids in a microfluidic volume according to the present disclosure allows for an increased density of processors in computing device, a server blade, a server rack, or a datacenter. For example, on-chip power delivery and cooling may allow for a dense stack of wafers with stacked-die processors that are not possible with conventional PCB power delivery and separate thermal management.

In some embodiments, an electrochemical generation system includes an electrochemical chamber with an ion-transfer membrane dividing the electrochemical chamber. The electrochemical chamber includes a first electrochemical fluid and a second electrochemical fluid separated by the ion-transfer membrane. In some embodiments, ion-transfer across the ion-transfer membrane between the first electrochemical fluid and the second electrochemical fluid produces an electric voltage and current to the processor or other electrical load and discharges the first electrochemical fluid. In some embodiments, an applied voltage from an electrical source (in place of the electrical load) results in a reverse transfer of ions across the ion-transfer membrane which charges the first electrochemical fluid.

In some embodiments, the electrochemical chamber is in fluid communication with a first storage tank and a second storage tank. For example, the first electrochemical fluid is stored in the first storage tank and can flow into the electrochemical chamber, and the second electrochemical fluid is stored in the second storage tank and can flow into the electrochemical chamber. A first pump and second pump may control the flow of the first electrochemical fluid and the flow of the second electrochemical fluid, respectively to the electrochemical chamber. In some embodiments, the rate of ion-transfer across the ion-transfer membrane is at least partially related to a flow rate of the first electrochemical fluid and the second electrochemical fluid into the electrochemical chamber (and in contact with the ion-transfer membrane).

The electrical charge produced by the ion transfer across the ion-transfer membrane may be collected at a first electrode and a second electrode positioned in or on the electrochemical chamber on opposite sides of the ion-transfer membrane. For example, a first electrode is in contact with the first electrochemical fluid and a second electrode is in contact with the second electrochemical fluid. The electrodes collect charge from the first electrochemical fluid and the second electrochemical fluid. In some embodiments, the first electrochemical fluid in an anolyte fluid, and the second electrochemical fluid is a catholyte fluid. In some embodiments, the anolyte fluid and the catholyte fluid is the same fluid or compound in different states of charge. In at least one embodiment, the anolyte fluid and the catholyte fluid are or include a Vanadium salt.

In some embodiments, an electrochemical generator system includes a first electrochemical chamber configured to discharge an electrochemical fluid and provide an electrical power to an electrical load (e.g., the processor), and the electrochemical generator system includes a second electrochemical chamber configured to receive electrical power from an electrical source (e.g., a power grid or other power source) to recharge the electrochemical fluid.

In some embodiments, the electrochemical fluid circulates through the electrochemical generator system, receiving electrical power from the electrical source and delivering the electrical power to the electrical load, substantially continuously. In some embodiments, the electrochemical fluid is stored in a storage tank until the electrical power is needed similarly to a battery, when pumps flow the electrochemical fluid. As described herein, a first electrochemical fluid and a second electrochemical fluid exchange ions across a first ion-transfer membrane in the first electrochemical chamber to discharge the first electrochemical fluid and produce electrical power. The first electrochemical fluid and a second electrochemical fluid exchange ions across a second ion-transfer membrane in the second electrochemical chamber to charge the first electrochemical fluid and store electrical power.

In some embodiments, at least a part of the electrochemical chamber configured to provide power is located in a microfluidic volume between dies on a stacked-die processor. For example, a first electrochemical fluid may be positioned in the microfluidic volume. In another example, a second electrochemical fluid may be positioned in the microfluidic volume. In yet another example, both the first electrochemical fluid and the second electrochemical fluid may be positioned in the microfluidic volume.

In some embodiments, a processing unit has a first die and a second die with a microfluidic volume positioned therebetween. In some embodiments, a minimum distance between the first die and the second die may be less than 100 microns. In some embodiments, a minimum distance between the first die and the second die may be less than 200 microns. In some embodiments, a minimum distance between the first die and the second die may be less than 300 microns. In some embodiments, a distance between the first die and the second die is substantially constant across the microfluidic volume. For example, the surfaces of the first die and second die that are proximate one another may be substantially planar and parallel. In other embodiments, at least a portion of the surfaces of the first die and second die that are proximate one another is non-planar, and a minimum distance between the first die and second die is defined by the location on the surfaces of the first die and second die that are closest to one another.

In some embodiments, the microfluidic volume of the processor is part of the electrochemical chamber configured to provide electrical power through the discharge of the first electrochemical fluid to the second electrochemical fluid. For example, an ion transfer across the ion-transfer membrane may generate an electrical potential between the first electrode(s) and the second electrode(s). In at least one example, first electrochemical fluid is positioned in the microfluidic volume on a first side of the second die and the second electrochemical fluid is positioned on a second side of the second die, with the ion-transfer membrane positioned between the first electrochemical fluid and the second electrochemical fluid. The second die may be positioned between the first electrodes and second electrodes to receive the electrical power. For example, the first electrochemical fluid may be an anolyte and the second electrochemical fluid may be a catholyte such that the second die (and the circuits thereof) are positioned as the electrical load between the first electrodes in contact with the anolyte and the second electrodes in contact with the catholyte.

In some embodiments, the processor is connected to a conventional PCB. In some embodiments, the processor is integrally formed with a silicon wafer. For example, a first die may be integrally formed with a silicon wafer. The first die and the second die, separated by the microfluidic volume, may be connected by one or more heat transfer structures positioned between the first die and the second die. In some embodiments, the heat transfer structures are configured to transfer heat from the first die and/or the second die to the first electrochemical fluid and/or the second electrochemical fluid positioned in the microfluidic volume.

While some processors according to the present disclosure have a first electrochemical fluid positioned in the microfluidic volume and a second electrochemical fluid positioned outside of the microfluidic volume, other embodiments of a processor have both the first electrochemical fluid and the second electrochemical fluid positioned in the microfluidic volume. For example, an ion-transfer membrane is positioned in the microfluidic volume to separate the first electrochemical fluid and the second electrochemical fluid. In at least one embodiment, the ion-transfer membrane is a heat transfer structure that allows the movement of ions across and heat through the membrane.

In some embodiments, a processing unit has a plurality of heat transfer structures positioned in a microfluidic volume between a first die and a second die. In some embodiments, at least one of the heat transfer structures is also an ion-transfer membrane. In some embodiments, at least one ion-transfer membrane is located in the microfluidic volume in addition to the heat transfer structures. For example, the heat transfer structures and ion-transfer membrane(s) may divide the microfluidic volume into a plurality of channels. In some embodiments, at least some adjacent channels have a first electrochemical fluid therein and a second electrochemical fluid therein, respectively, to allow ion transfer across the ion-transfer membrane.

In some embodiments, the heat transfer structures are straight fins that define two electrochemical chambers adjacent to one another, which are each divided by ion-transfer membranes positioned therein to create a first channel and a second channel in each electrochemical chamber. In some embodiments, the electrochemical chambers allow flow of the first electrochemical fluid in the first channel and the second electrochemical fluid in the second channel. In other examples, at least part of the heat transfer structure may be curved or have a curved portion. For example, a first heat transfer structure may be curved relative to another heat transfer structure such that the cross-sectional area of a channel varies in a flow direction of the electrochemical fluid. In at least one embodiment, the cross-sectional area of a channel increases in the direction of flow to decrease the velocity of the electrochemical fluid through the channel. In at least one embodiment, the cross-sectional area of a channel decreases in the direction of flow to increase the velocity of the electrochemical fluid through the channel.

In some embodiments, the first electrochemical fluid in the first channel is separated from the second electrochemical fluid in the second channel by an ion-transfer membrane creates an electric potential between the first electrode(s) position in the first channel and the second electrode(s) positioned in the second channel. In some embodiments, both the first die and the second die have electrodes positioned in contact with one or more of the first electrochemical fluid and the second electrochemical fluid. The first die and second die can, therefore, both receive electrical power from the electrochemical fluids while the electrochemical fluids receive heat from the first die and second die to exhaust the heat therefrom. In some embodiments, the heat transfer structures further transfer heat to the electrochemical fluids. In some embodiments, at least one of the ion-transfer membranes is a heat transfer structure.

In some embodiments, a stacked-die processor has a first die, a second die, and a third die. In some embodiments, a first microfluidic volume is located between the first die and the second die, and a second microfluidic volume is located between second die and the third die. In some embodiments, a first electrochemical fluid is located in the first microfluidic volume and a second electrochemical fluid is located in the second microfluidic volume. The first microfluidic volume and the second microfluidic volume form at least part of an electrochemical chamber that is divided by the second die and an ion-transfer membrane. In some embodiments, a first electrode and a second electrode contacting the first electrochemical fluid and the second electrochemical fluid, respectively, allows the electrochemical chamber to provide electrical power to at least the second die. In some embodiments, one or more TSVs located in heat transfer structures or other structures between the second die and the first die and/or third die can transmit electrical power from the electrodes to different parts of the processor.

In some embodiments, a flow direction of the first electrochemical fluid and the second electrochemical fluid are oriented in the same direction relative to the processor. In some embodiments, the flow direction of the first electrochemical fluid and the second electrochemical fluid are oriented different directions relative to the processor. For example, a flow direction of the first electrochemical fluid may be opposite a flow direction of the second electrochemical fluid relative to the processor. In some examples, orienting the flow directions opposite one another may allow the first electrochemical fluid and second electrochemical fluid to more efficiently receive heat from the dies and/or heat transfer structures of the stacked-die processor and cool the stacked-die processor.

In some embodiments, a stacked-die processor has an ion-transfer membrane located in the microfluidic volume and co-planar with the first die and the second die. In some embodiments, the microfluidic volume between the first die and the second die defines at least a portion of the electrochemical chamber. An ion-transfer membrane divides the microfluidic volume and separates the first electrochemical fluid from the second electrochemical fluid. In some embodiments, electrodes receive the electrical power produced by the ion transfer across the ion-transfer membrane, and the TSVs electrically connect the first die and the second die may conduct electricity therebetween.

In some embodiments, an electrochemical generator system includes a heat exchanger. In some embodiments, an electrochemical generator system includes a first electrochemical chamber configured to discharge an electrochemical fluid and provide an electrical power to an electrical load (e.g., the processor), and the electrochemical generator system includes a second electrochemical chamber configured to receive electrical power from an electrical source (e.g., a power grid or other power source) to recharge the electrochemical fluid.

In some embodiments, the electrochemical fluid circulates through the electrochemical generator system, receiving electrical power from the electrical source and delivering the electrical power to the electrical load, substantially continuously. In some embodiments, the electrochemical fluid is stored in a storage tank until the electrical power is needed similarly to a battery, when pumps flow the electrochemical fluid. A first electrochemical fluid and a second electrochemical fluid exchange ions across a first ion-transfer membrane in the first electrochemical chamber to discharge the first electrochemical fluid and produce electrical power. The first electrochemical fluid and a second electrochemical fluid exchange ions across a second ion-transfer membrane in the second electrochemical chamber to charge the first electrochemical fluid and store electrical power.

In some embodiments, at least a part of the electrochemical chamber configured to provide power is located in a microfluidic volume between dies on a stacked-die processor as illustrated and described herein. For example, a first electrochemical fluid may be positioned in the microfluidic volume. In another example, a second electrochemical fluid may be positioned in the microfluidic volume. In yet another example, both the first electrochemical fluid and the second electrochemical fluid may be positioned in the microfluidic volume.

The first electrochemical fluid and second electrochemical fluid may receive heat from the stacked-die processor or other heat-generating component of the electrochemical generator system. The first electrochemical fluid and second electrochemical fluid may flow from the stacked-die processor or other heat-generating component to the heat exchanger and exhaust at least a portion of the heat from the first electrochemical fluid and second electrochemical fluid. The first electrochemical fluid and second electrochemical fluid can thereby provide electrical power directly to the processor and remove heat from the processor in a single medium passing through the microfluidic volume of the processor.

The combined electrical power delivery and cooling in the microfluidic volume of stacked-die processors allows, in some embodiments, for increased density of processors. In some embodiments, a computing system such as a server stack has electrochemical power generation and cooling in the microfluidic volumes of the processors. The server stack includes a plurality of wafers with stacked-die processors located thereon. For example, the stacked die processors may be integrally formed with a wafer with a microfluidic volume in the stacked-die processor formed in the material (e.g., silicon) of the wafer.

In some embodiments, the microfluidic volume receives one or more electrochemical fluids from a manifold or other delivery element of the server stack that directs charged electrochemical fluid to the stacked-die processor to provide electrical power as described in relation to any of the embodiments described herein. The electrochemical fluid(s) discharges at the stacked-die processor to provide electrical power and receives heat from the stacked-die processor. The discharged and hot electrochemical fluid flows through a return conduit to a charging device to recharge the electrochemical fluid with energy from a power source. In some embodiments, the charging device includes a heat exchanger to exhaust the heat from the electrochemical fluid. In some embodiments, the heat exchanger exhausts heat from the electrochemical fluid to the ambient atmosphere. In some embodiments, the heat exchanger exhausts heat from the electrochemical fluid to another cooling fluid, such as in a secondary liquid cooling system.

In some embodiments, a manifold is configured to deliver electrochemical fluid to a portion of a computing system, such as the server stack described herein. In some embodiments, the manifold includes an anolyte delivery conduit (e.g., tube or pipe) configured to deliver an anolyte fluid to a plurality of wafers of the server stack. The manifold further includes a catholyte delivery conduit configured to deliver a catholyte fluid to a plurality of wafers of the server stack. In at least one embodiment, the manifold includes capillary conduits that connect the anolyte delivery conduit and the catholyte delivery conduit to the microfluidic volume of the stacked-die processors.

In some examples, a first wafer includes a processor with a first die and a second die and a second processor with a third die and a fourth die. The capillary conduits are configured to deliver the anolyte fluid and the catholyte fluid from the manifold to the first microfluidic volume between the first die and the second die and to the second microfluidic volume between the third die and the fourth die. In some embodiments, the microfluidic volumes each include an ion-transfer membrane such that the microfluidic volume is an electrochemical chamber as described in relation to any of the embodiments described herein. In some embodiments, the microfluidic volumes each include a heat transfer structure connecting the dies to one another to transfer heat from the dies to the electrochemical fluid(s) as described in relation to any of the embodiments described herein. In some embodiments, the microfluidic volumes each include TSVs to electrically connect the dies to one another as described in relation to any of the embodiments described herein. In at least one embodiment, at least one of the TSVs is located in the heat-transfer structure(s) positioned in the microfluidic volume. For example, the heat-transfer structures may include straight fins that divide the microfluidic volumes into channels, and the TSVs may be positioned in the straight fins to allow electrical connection between the dies of each stacked-die processor.

After at least partially discharging in the microfluidic volume, the electrochemical fluids (e.g., the anolyte fluid and the catholyte fluid) flow from the stacked-die processor to the return conduit, where the discharged electrochemical fluids flow toward a charging device to recharge the electrochemical fluids with energy from a power source and/or a heat exchanger to exhaust the heat from the electrochemical fluids.

In some embodiments, the manifold flows electrochemical fluid from the manifold, through the microfluidic volumes, to the return conduit in an outward direction of the server stack. For example, the manifold may be a central manifold that flows electrochemical fluid radially outward from the central manifold. In some embodiments, the manifold flows electrochemical fluid radially outward in a first wafter and radially inward on a second wafer. For example, counterflow of the electrochemical fluid on different wafers may distribute heat more evenly throughout the server stack and reduce areas of concentrated heat. In at least one example, a first manifold is a central manifold in a center of the wafers, and a second manifold is a radial manifold that is located at a radially outward position.

In some embodiments, a method of power delivery and thermal management in a stacked-die processor includes providing an electrochemical fluid to a microfluidic volume of the stacked-die processor. In some embodiments, the electrochemical fluid includes an anolyte fluid. In some embodiments, the electrochemical fluid includes a catholyte fluid. In some embodiments, the electrochemical fluid includes both an anolyte fluid and a catholyte fluid.

The method further includes generating electrical power at the stacked-die processor with the electrochemical fluid. For example, generating electrical power at the stacked-die processor may include discharging an anolyte fluid in the microfluidic volume. In other examples, generating electrical power at the stacked-die processor may include receiving ions with a catholyte fluid in the microfluidic volume. In yet other examples, generating electrical power at the stacked-die processor may include transferring ions across an ion-transfer membrane located in the microfluidic volume. In some embodiments, generating electrical power at the stacked-die processor includes receiving electrical charge at one or more electrodes located in the microfluidic volume.

The method, in some embodiments, further includes receiving heat from the stacked-die processor with the electrochemical fluid in the microfluidic volume. For example, the electrochemical fluid may contact and/or receive heat from a first die, a second die, a heat transfer structure connected to the first die and/or second die, or other parts of the stacked-die processor when located in the microfluidic volume. The heat received by the electrochemical fluid cools the stacked-die processor and the method includes exhausting the heat from the electrochemical fluid at a heat exchanger.

In some embodiments, the method further includes recharging the electrochemical fluid at a charging device. In some embodiments, the electrochemical fluid is recharged before exhausting the heat at the heat exchanger. In some embodiments, the electrochemical fluid is recharged after exhausting the heat at the heat exchanger. In some embodiments, the electrochemical fluid is recharged while exhausting the heat at the heat exchanger. For example, the charging device may include a heat exchanger therein.

Recirculating the recharged and cooled electrochemical fluid can allow the electrochemical fluid to provide electrical power and thermal management directly to the dies of a stacked-die processor substantially continuously. In at least one embodiment, delivery of electrochemical fluid to the microfluidic volume of a stacked-die processor can allow combined power delivery and thermal management and allow for smaller, more powerful, more efficient, and more reliable processors.

The present disclosure relates to systems and methods for combined power delivery and cooling to a processor according to at least the examples provided in the sections below:

[A1] In some embodiments, a processing unit includes a first die and a second die with a microfluidic volume between the first die and the second die. At least one heat transfer structure couples the first die to the second die and is located in the microfluid volume. An electrochemical fluid is positioned in the microfluidic volume to provide electrochemical energy to at least one of the first die and the second die and receive heat from the first die and the second die.

[A2] In some embodiments, the electrochemical fluid of [A1] is an anolyte fluid, and a catholyte fluid is separated from the anolyte fluid by a membrane.

[A3] In some embodiments, the membrane and catholyte fluid of [A2] are located in the microfluidic volume.

[A4] In some embodiments, the heat transfer structure of [A3] is the membrane.

[A5] In some embodiments, the heat transfer structure of [A4] divides the microfluidic volume into at least a first channel and a second channel, wherein the anolyte fluid is located in the first channel and the catholyte fluid is located in the second channel.

[A6] In some embodiments, a cross-sectional area of the first channel of [A5] changes in a direction of flow of the anolyte fluid therein.

[A7] In some embodiments, the heat transfer structure of [A5] is curved in a direction of flow of the anolyte fluid.

[A8] In some embodiments, at least part of the membrane of [A2] includes the second die.

[A9] In some embodiments, the heat transfer structure of any of [A1] through [A8] includes a plurality of pin fins.

[A10] In some embodiments, the processing unit of any of [A1] through [A9] includes a charging device in fluid communication with the microfluidic volume and configured to recharge a discharged electrochemical fluid with a power source after the electrochemical fluid provides electrochemical energy to at least one of the first die and the second die.

[A11] In some embodiments, the processing unit of any of [A1] through [A10] includes a heat exchanger in communication with the microfluidic volume and configured to configured to exhaust heat from the electrochemical fluid.

[A12] In some embodiments, the microfluidic volume of any of [A1] through [A11] is a first microfluidic volume and the processing unit further comprises a second microfluidic volume proximate the first die and opposite the first microfluidic volume wherein at least a portion of the electrochemical fluid is positioned in the second microfluidic volume provide electrochemical energy to the first die and receive heat from the first die.

[A13] In some embodiments, the processing unit of any of [A1] through [A12] further comprising an electrochemical fluid positioned in the microfluidic volume to provide electrochemical energy to at least one of the first die and the second die and receive heat from the first die and second die.

[B1] In some embodiments, a computing system includes a first wafer, a second wafer, and a manifold. The first wafer includes a first die and a second die with a first microfluidic volume between the first die and the second die. A first plurality of heat transfer structures couples the first die to the second die and is located in the first microfluid volume. The second wafer includes a third die and a fourth die with a second microfluidic volume between the third die and the fourth die. A second plurality of heat transfer structures couples the third die to the fourth die and is located in the second microfluid volume. The manifold is configured to flow an electrochemical fluid through the first microfluidic volume and the second microfluidic volume. The electrochemical fluid is configured to provide electrical power to the first die and second die and to receive heat from the first plurality of heat transfer structures and the second plurality of heat transfer structures.

[B2] In some embodiments, the heat transfer structures of [B1] include straight fins.

[B3] In some embodiments, the first wafer of [B1] or [B2] further includes through-silicon vias (TSVs) electrically connecting the first die to the second die.

[B4] In some embodiments, the second wafer of [B3] further includes TSVs electrically connecting the third die to the fourth die.

[B5] In some embodiments, a first flow direction of the electrochemical fluid of any of [B1] through [B4] through the first microfluidic volume is opposite a second flow direction of the electrochemical fluid through the second microfluidic volume.

[C1] In some embodiments, a method of providing power and cooling to a stacked-die processor includes providing an electrochemical fluid to a microfluidic volume of the stacked-die processor, generating electrical power at the stacked-die processor with the electrochemical fluid, receiving heat from the stacked-die processor with the electrochemical fluid in the microfluidic volume, and exhausting the heat from the electrochemical fluid at a heat exchanger.

[C2] In some embodiments, the method of [C1] further includes recharging the electrochemical fluid at a charging device.

[C3] In some embodiments, generating the electrical power at the stacked-die processor with the electrochemical fluid of [C1] or [C2] includes transferring ions across an ion-transfer membrane located in the microfluidic volume.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the scope of the present disclosure, and that various changes, substitutions, and alterations may be made to embodiments disclosed herein without departing from the scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A processing unit comprising:
    a first die;
    a second die;
    a microfluidic volume between the first die and the second die, the microfluidic volume configured to receive an electrochemical fluid flowing through the microfluidic volume;
    a membrane positioned within the microfluidic volume configured to separate an anolyte fluid and a catalytic fluid of the electrochemical fluid; and
    a heat transfer structure coupling the first die to the second die and located in the microfluidic volume.

2. The processing unit of claim 1, wherein the electrochemical fluid is an anolyte fluid, and a catholyte fluid is separated from the anolyte fluid by a membrane.

3. The processing unit of claim 2, wherein the membrane and catholyte fluid are located in the microfluidic volume.

4. The processing unit of claim 3, wherein the heat transfer structure is the membrane.

5. The processing unit of claim 4, wherein the heat transfer structure divides the microfluidic volume into at least a first channel and a second channel,
    wherein the anolyte fluid is located in the first channel and the catholyte fluid is located in the second channel.

6. The processing unit of claim 5, wherein a cross-sectional area of the first channel varies along a length of the first fluid channel.

7. The processing unit of claim 5, wherein the heat transfer structure is curved in a direction of flow of the anolyte fluid.

8. The processing unit of claim 2, wherein at least part of the membrane includes the second die.

9. The processing unit of claim 1, wherein the heat transfer structure includes a plurality of pin fins.

10. The processing unit of claim 1, further comprising a charging device in fluid communication with the microfluidic volume and configured to recharge a discharged electrochemical fluid with a power source after the electrochemical fluid provides electrochemical energy to at least one of the first die and the second die.

11. The processing unit of claim 1, further comprising a heat exchanger in communication with the microfluidic volume and configured to exhaust heat from the electrochemical fluid.

12. The processing unit of claim 1, wherein the microfluidic volume is a first microfluidic volume and the processing unit further comprises a second microfluidic volume proximate the first die and opposite the first microfluidic volume, and wherein at least a portion of the electrochemical fluid is positioned in the second microfluidic volume to provide electrochemical energy to the first die and receive heat from the first die.

13. A computing system comprising:
   a first wafer including:
      a first die,
      a second die,
      a first microfluidic volume between the first die and the second die, and
      a first plurality of heat transfer structures coupling the first die to the second die and located in the first microfluidic volume;
   a second wafer including:
      a third die,
      a fourth die,
      a second microfluidic volume between the third die and the fourth die, and
      a second plurality of heat transfer structures coupling the third die to the fourth die and located in the second microfluidic volume; and
   a manifold configured to flow an electrochemical fluid through the first microfluidic volume and the second microfluidic volume, the electrochemical fluid configured to provide electrical power to the first die and second die and to receive heat from the first plurality of heat transfer structures and the second plurality of heat transfer structures.

14. The computing system of claim 13, wherein the heat transfer structures include straight fins.

15. The computing system of claim 13, further comprising through-silicon vias (TSVs) electrically connecting the first die to the second die.

16. The computing system of claim 15, further comprising TSVs electrically connecting the third die to the fourth die.

17. The computing system of claim 13, wherein a first flow direction of the electrochemical fluid through the first microfluidic volume is opposite a second flow direction of the electrochemical fluid through the second microfluidic volume.

18. A method of providing power and cooling to a stacked-die processor, the method comprising: providing an electrochemical fluid to a microfluidic volume of the stacked-die processor;
   using the electrochemical fluid, generating electrical power at the stacked-die processor;
   receiving heat from the stacked-die processor with the electrochemical fluid in the microfluidic volume; and
   exhausting the heat from the electrochemical fluid at a heat exchanger.

19. The method of claim 18 further comprising recharging the electrochemical fluid at a charging device.

20. The method of claim 18, wherein generating the electrical power at the stacked-die processor with the electrochemical fluid includes transferring ions across an ion-transfer membrane located in the microfluidic volume.

* * * * *